US012777674B2

(12) United States Patent
Zhu et al.

(10) Patent No.: US 12,777,674 B2
(45) Date of Patent: Oct. 27, 2026

(54) VERTICAL MOSFET DEVICE AND METHOD OF MANUFACTURING VERTICAL MOSFET DEVICE

(71) Applicants: Beijing Superstring Academy of Memory Technology, Beijing (CN); Institute of Microelectronics, Chinese Academy of Sciences, Beijing (CN)

(72) Inventors: Huilong Zhu, Poughkeepsie, NY (US); Zhongrui Xiao, Beijing (CN)

(73) Assignees: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 508 days.

(21) Appl. No.: 18/263,472

(22) PCT Filed: Dec. 14, 2021

(86) PCT No.: PCT/CN2021/137863
§ 371 (c)(1),
(2) Date: Jul. 28, 2023

(87) PCT Pub. No.: WO2023/102965
PCT Pub. Date: Jun. 15, 2023

(65) Prior Publication Data

US 2024/0313103 A1 Sep. 19, 2024

(30) Foreign Application Priority Data

Dec. 10, 2021 (CN) ........................ 202111514468.9

(51) Int. Cl.
*H10D 30/66* (2025.01)
*H10D 30/01* (2025.01)
(Continued)

(52) U.S. Cl.
CPC ......... *H10D 30/66* (2025.01); *H10D 30/0291* (2025.01); *H10D 62/235* (2025.01);
(Continued)

(58) Field of Classification Search
CPC .... H10D 30/63; H10D 30/635; H10D 30/693; H10D 30/0291–0297;
(Continued)

(56) References Cited

U.S. PATENT DOCUMENTS 8,575,686 B2 * 11/2013 Masuoka ............... H10B 41/27 257/329
8,946,670 B1 * 2/2015 Park ....................... H10B 61/22 257/329

(Continued)

FOREIGN PATENT DOCUMENTS

CN 102237311 A 11/2011
CN 106298778 A 1/2017

(Continued)

OTHER PUBLICATIONS

International Search Report issued in International Application No. PCT/CN2021/137863 dated Aug. 1, 2022 (2 pages).

(Continued)

*Primary Examiner* — Maliheh Malek
(74) *Attorney, Agent, or Firm* — Osha Bergman Watanabe & Burton LLP

(57) ABSTRACT

The vertical MOSFET device includes: an active region including a first source/drain layer, a channel layer and a second source/drain layer vertically stacked on a substrate in sequence, wherein an outer periphery of the channel layer is
(Continued)

recessed with respect to outer peripheries of the first source/drain layer and the second source/drain layer; a spacing layer including an upper spacing layer and a lower spacing layer, wherein the upper spacing layer and the lower spacing layer are both in contact with a side surface of the channel layer and are not in communication with each other; and a gate stack formed at least on a lateral outer periphery of the channel layer and embedded in a groove space between the upper spacing layer and the lower spacing layer.

13 Claims, 12 Drawing Sheets

(51) Int. Cl.

| | |
|---|---|
| ***H10D 62/17*** | (2025.01) |
| ***H10D 64/01*** | (2025.01) |
| ***H10D 64/27*** | (2025.01) |
| ***H10P 52/40*** | (2026.01) |
| ***H10P 76/20*** | (2026.01) |

(52) U.S. Cl.

CPC ......... *H10D 64/017* (2025.01); *H10D 64/512* (2025.01); *H10P 52/402* (2026.01); *H10P 76/2041* (2026.01)

(58) Field of Classification Search

CPC ....... H10D 30/66–669; H10D 30/6728; H10D 62/235; H10D 64/017; H10D 64/512; H10D 30/025; H10D 30/60; H10P 52/402; H10P 76/2041

See application file for complete search history.

(56) References Cited

U.S. PATENT DOCUMENTS

| | | | | |
|---|---|---|---|---|
| 9,406,793 | B2 * | 8/2016 | Zhao | H10D 30/025 |
| 9,443,982 | B1 * | 9/2016 | Balakrishnan | H10D 30/025 |
| 9,530,866 | B1 * | 12/2016 | Zhang | B82Y 10/00 |
| 9,548,250 | B1 * | 1/2017 | Basker | H10D 30/024 |
| 9,711,618 | B1 * | 7/2017 | Cheng | H10D 30/025 |
| 9,755,073 | B1 * | 9/2017 | Cheng | H10D 30/025 |
| 9,768,166 | B1 * | 9/2017 | Cheng | H10D 30/0221 |
| 9,773,913 | B1 * | 9/2017 | Balakrishnan | H10D 30/0212 |
| 9,780,088 | B1 * | 10/2017 | Balakrishnan | H10D 30/025 |
| 9,799,655 | B1 * | 10/2017 | Cheng | H10D 30/024 |
| 9,799,777 | B1 * | 10/2017 | Balakrishnan | H10D 30/025 |
| 9,806,191 | B1 * | 10/2017 | He | H10D 30/63 |
| 9,812,443 | B1 * | 11/2017 | Cheng | H10D 1/692 |
| 9,831,131 | B1 * | 11/2017 | Jacob | H10D 30/014 |
| 9,991,267 | B1 * | 6/2018 | Anderson | H10B 12/03 |
| 10,115,824 | B2 * | 10/2018 | Gluschenkov | H10D 30/024 |
| 10,192,867 | B1 * | 1/2019 | Frougier | H10D 30/014 |
| 10,217,846 | B1 * | 2/2019 | Xie | H10D 30/025 |
| 11,127,783 | B2 * | 9/2021 | Zhu | H10B 61/00 |
| 11,152,507 | B2 * | 10/2021 | Zhang | H10D 30/025 |
| 11,677,001 | B2 * | 6/2023 | Zhu | H10D 30/014<br>257/183 |
| 12,317,511 | B2 * | 5/2025 | Zhu | H10D 30/63 |
| 2011/0303966 | A1 * | 12/2011 | Masuoka | H10B 41/27<br>438/257 |
| 2012/0146090 | A1 * | 6/2012 | Lui | H10B 12/053<br>257/E29.198 |
| 2017/0077304 | A1 * | 3/2017 | Obradovic | H10D 30/021 |
| 2017/0373162 | A1 * | 12/2017 | Cheng | H10D 30/024 |
| 2018/0096896 | A1 * | 4/2018 | Zhu | H10D 30/63 |
| 2018/0102434 | A1 * | 4/2018 | He | H10D 30/63 |
| 2018/0122913 | A1 * | 5/2018 | Xie | B82Y 10/00 |
| 2018/0277445 | A1 * | 9/2018 | Gluschenkov | H10D 30/63 |
| 2019/0245083 | A1 * | 8/2019 | Reznicek | H10D 30/025 |
| 2019/0287863 | A1 * | 9/2019 | Xie | H10B 20/40 |
| 2020/0006389 | A1 * | 1/2020 | Huang | H10D 30/031 |
| 2020/0052079 | A1 * | 2/2020 | Li | H10D 30/025 |
| 2020/0135921 | A1 * | 4/2020 | Chiang | H10D 30/023 |
| 2020/0144254 | A1 * | 5/2020 | Song | H10D 30/62 |
| 2020/0144418 | A1 * | 5/2020 | Do | H02M 7/537 |
| 2020/0212226 | A1 * | 7/2020 | Reznicek | H03K 19/0948 |
| 2020/0295146 | A1 * | 9/2020 | Do | H10D 30/63 |
| 2020/0303497 | A1 * | 9/2020 | Yeh | H10D 30/025 |
| 2021/0226004 | A1 * | 7/2021 | Zhu | H10D 30/014 |
| 2021/0242202 | A1 * | 8/2021 | Do | H10D 30/63 |
| 2021/0384324 | A1 * | 12/2021 | Seo | H10D 30/025 |
| 2021/0408118 | A1 * | 12/2021 | Zhu | H10N 50/01 |
| 2022/0199785 | A1 * | 6/2022 | Xie | H10D 30/025 |
| 2023/0145135 | A1 * | 5/2023 | Mignot | H10D 30/025<br>257/288 |
| 2024/0105846 | A1 * | 3/2024 | Lu | H10B 12/033 |
| 2024/0113178 | A1 * | 4/2024 | Anderson | H10D 30/025 |
| 2025/0126770 | A1 * | 4/2025 | Zhu | H10B 10/125 |

FOREIGN PATENT DOCUMENTS

| | | | |
|---|---|---|---|
| CN | 107507863 | A | 12/2017 |
| CN | 111106177 | A | 5/2020 |
| EP | 3454378 | A1 | 3/2019 |
| JP | 2004349428 | A | 12/2004 |

OTHER PUBLICATIONS

Written Opinion issued in International Application No. PCT/CN2021/137863 dated Aug. 1, 2022 (4 pages).

Office Action issued in corresponding Chinese Application No. 202111514468.9 mailed on Mar. 14, 2025 (12 pages).

* cited by examiner

VERTICAL MOSFET DEVICE AND METHOD OF MANUFACTURING VERTICAL MOSFET DEVICE

CROSS REFERENCE TO RELATED APPLICATION

This application is a Section 371 National Stage Application of International Application No. PCT/CN2021/137863, filed on Dec. 14, 2021, entitled "VERTICAL MOSFET DEVICE AND METHOD OF MANUFACTURING VERTICAL MOSFET DEVICE", which claims priority to Chinese Application No. 202111514468.9, filed on Dec. 10, 2021, incorporated herein by reference in their entirety.

TECHNICAL FIELD

The present disclosure relates to a field of semiconductors, in particular to a vertical MOSFET device and method of manufacturing a vertical MOSFET device.

BACKGROUND

Currently, a planar Metal Oxide Semiconductor Field Effect Transistor (MOSFET) may not be easily downsized because a source electrode, a gate electrode, and a drain electrode are arranged in a horizontal direction. A vertical MOSFET device has advantages over a horizontal MOSFET device because the source electrode, the gate electrode, and the drain electrode are perpendicular to a scaling direction.

However, the existing vertical MOSFET device still has technical defects that are difficult to overcome. For example, it is difficult to control a gate length of the vertical MOSFET device, especially for a single crystal channel material. In addition, if a channel material is polycrystalline, a channel resistance is much higher than that of single crystal, and it is difficult to stack a plurality of vertical devices due to a total resistance being too high.

SUMMARY

In view of above, an object of the present disclosure is at least in part to provide a vertical MOSFET device with a self-aligned spacer and a method of manufacturing a vertical MOSFET device.

According to an aspect of the present disclosure, there is provided a vertical MOSFET device, including: a substrate; an active region including a first source/drain layer, a channel layer and a second source/drain layer vertically stacked on the substrate in sequence, wherein an outer periphery of the channel layer is recessed with respect to an outer periphery of the first source/drain layer and an outer periphery of the second source/drain layer; a spacing layer including an upper spacing layer and a lower spacing layer, wherein the upper spacing layer is formed on a lower surface of the second source/drain layer exposed by a recess of the channel layer, the lower spacing layer is formed on an upper surface of the first source/drain layer exposed by the recess of the channel layer, and the upper spacing layer and the lower spacing layer are in contact with a side surface of the channel layer and are not in communication with each other; and a gate stack formed at least on a lateral outer periphery of the channel layer and embedded in a groove space between the upper spacing layer and the lower spacing layer.

According to another aspect of the present disclosure, there is provided a method of manufacturing a vertical MOSFET device, including: forming an active region including a first source/drain layer, a channel layer and a second source/drain layer sequentially on a substrate in a vertical direction, wherein an outer periphery of the channel layer have a recess portion with respect to an outer periphery of the first source/drain layer and an outer periphery of the second source/drain layer; covering a dummy structure layer on an outer surface of the active region, selectively etching the dummy structure layer, so that an upper surface of the first source/drain layer and a lower surface of the second source/drain layer respectively retain a second portion dummy structure layer, wherein the second portion dummy structure layer sandwiches the channel layer from opposite sides of the channel layer; growing a dummy gate structure layer in a groove space formed by an inner wall of the second portion dummy structure layer and the outer periphery of the channel layer, and replacing the second portion dummy structure layer with a spacing layer; forming a first dielectric layer on the first source/drain layer, removing the dummy gate structure layer, and forming a gate dielectric layer and a gate conductor layer on the groove space and the first dielectric layer; selectively etching the gate conductor layer, and forming metal contact portions on the first source/drain layer, the gate conductor layer and the second source/drain layer, respectively.

According to another aspect of the present disclosure, there is provided an electronic device including the vertical MOSFET device described above.

BRIEF DESCRIPTION OF THE DRAWINGS

The above and other objectives, features and advantages of the present disclosure will be more apparent through the following description of embodiments of the present disclosure with reference to the accompanying drawings.

FIG. 1 schematically shows a cross-sectional view of a stack disposed on a substrate.

FIG. 2 schematically shows a cross-sectional view of etching a first source/drain layer on a stack.

FIG. 3 schematically shows a cross-sectional view of forming a channel layer by a selective etching.

FIG. 4 schematically shows a cross-sectional view of covering a dummy structure layer on an outer surface of an active region.

FIG. 5 schematically shows a cross-sectional view of a primary selective etching of a dummy structure layer.

FIG. 6 schematically shows a cross-sectional view of a further selective etching of a dummy structure layer.

FIG. 7 schematically shows a cross-sectional view of growing a dummy gate structure layer in a groove space.

FIG. 8 schematically shows a cross-sectional view of a spacing layer after replacement.

FIG. 9 schematically shows a cross-sectional view of forming a first dielectric layer.

FIG. 10 schematically shows a cross-sectional view of forming a gate dielectric layer and a gate conductor layer.

FIG. 11(*a*) schematically shows a cross-sectional view of spin-coating a photoresist on a gate conductor layer.

FIG. 11(*b*) schematically shows a cross-sectional view of etching a gate conductor layer.

FIG. 12 schematically shows a cross-sectional view of forming a metal contact portion.

REFERENCE NUMERALS

Figure 1:
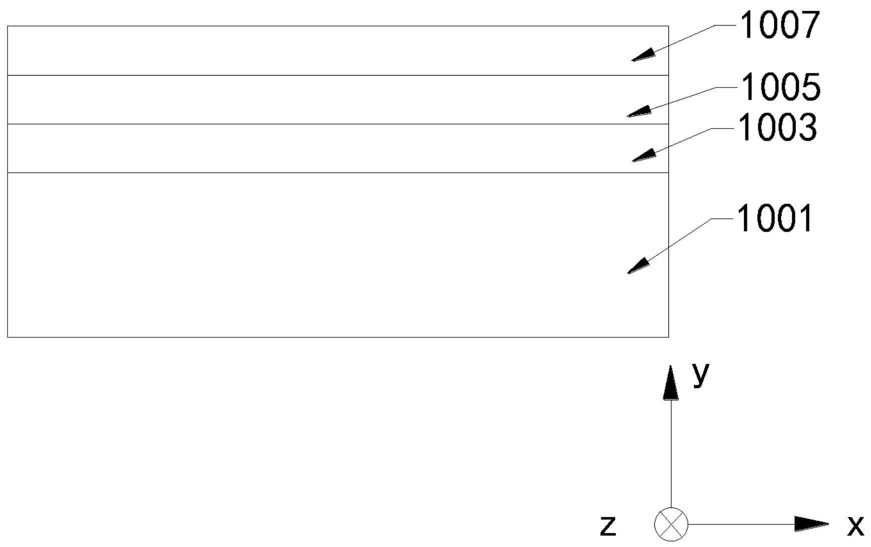
FIG. 1 to FIG. 12 schematically show cross-sectional views of a method of manufacturing a storage device at different stages in sequence according to embodiments of the present disclosure.

1001—substrate; 1003—first source/drain layer; 1005—channel defining layer;

1007—second source/drain layer; 200—channel layer; 1009—dummy structure layer;
10091—first portion dummy structure layer; 10092—second portion dummy structure layer;
2001—dummy gate structure layer; 3001—spacing layer; 3002—gate dielectric layer;
4001—first dielectric layer; 4002—second dielectric layer; 500—photoresist;
5001—gate conductor layer; 6001—first source/drain contact portion; 6002—gate contact portion;
6003—second source/drain contact portion.

Throughout the drawings, the same or similar reference numerals represent the same or similar components. The accompanying drawings are not necessarily drawn to scale, and especially for the sake of clarity, the drawing scale of the section views is different from that of the top views.

DETAILED DESCRIPTION OF EMBODIMENTS

Embodiments of the present disclosure will be described below with reference to the accompanying drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to embodiments of the present disclosure are shown in the accompanying drawings. The drawings are not drawn to scale. Some details are enlarged and some details may be omitted for clarity of presentation. Shapes of various regions and layers as well as the relative size and positional relationship thereof shown in the drawings are only exemplary. In practice, there may be deviations due to manufacturing tolerances or technical limitations, and those skilled in the art may additionally design regions/layers with different shapes, sizes, and relative positions according to actual needs.

In the context of the present disclosure, when a layer/element is referred to as being "on" another layer/element, the layer/element may be directly on the other layer/element, or there may be an intermediate layer/element between them. In addition, if a layer/element is located "on" another layer/element in one orientation, the layer/element may be located "under" the other layer/element when the orientation is reversed.

The present disclosure may be presented in various forms, some examples of which will be described below. In the following descriptions, a selection of various materials is involved. In the selection of materials, in addition to a function of the material (for example, a semiconductor material may be used to form the active region, and a dielectric material may be used to form an electrical isolation), the etching selectivity is also considered. In the following descriptions, a required etching selectivity may or may not be indicated. It should be clear to those skilled in the art that when it is mentioned below that a material layer is etched, if it is not mentioned or shown that other layers are also etched, then the etching may be selective, and the material layer may have an etching selectivity relative to other layers exposed to a same etching recipe.

Embodiments of the present disclosure provide a vertical MOSFET device. The vertical MOSFET device refers to that an active region (especially a channel region) of the vertical MOSFET device extends in a vertical direction (e.g., a direction perpendicular or substantially perpendicular to a substrate surface) with respect to a substrate. The active region may be made of a single crystal semiconductor material to improve a device performance. A gate stack may be formed around an outside of a middle portion of the active region. The vertical MOSFET device may be based on a vertical type Metal Oxide Field Effect Transistor (MOSFET). Compared to a horizontal type MOSFET, the vertical type MOSFET may have a smaller footprint and a smaller leakage current, but a relatively smaller on-current.

The vertical MOSFET device provided by embodiments of the present disclosure includes: a substrate; an active region including a first source/drain layer 1003, a channel layer 200 and a second source/drain layer 1007 vertically stacked on the substrate in sequence, wherein an outer periphery of the channel layer 200 is recessed with respect to outer peripheries of the first source/drain layer 1003 and the second source/drain layer 1007; a spacing layer 3001 including an upper spacing layer and a lower spacing layer, wherein the upper spacing layer is formed on a lower surface of the second source/drain layer 1007 exposed by a recess of the channel layer 200, the lower spacing layer is formed on an upper surface of the first source/drain layer 1003 exposed by the recess of the channel layer 200, the upper spacing layer and the lower spacing layer are both in contact with a side surface of the channel layer 200 and are not in communication with each other; and a gate stack formed at least on a lateral outer periphery of the channel layer 200 and embedded in a groove space between the upper spacing layer and the lower spacing layer.

According to embodiments of the present disclosure, each of the first source/drain layer 1003, the channel layer 200 and the second source/drain layer 1007 has a thickness of 10 nm to 100 nm.

According to embodiments of the present disclosure, the gate stack includes a gate dielectric layer 3002 and a gate conductor layer 5001, and the gate conductor layer 5001 includes a work function adjusting metal and a gate conductive metal disposed on the work function adjusting metal.

According to embodiments of the present disclosure, the vertical MOSFET device further includes: a first dielectric layer 4001 disposed on the first source/drain layer 1003.

Further, a height of the first dielectric layer 4001 is higher than a bottom surface of the channel layer 200 and lower than a top surface of the lower spacing layer immediately adjacent the bottom surface of the channel layer 200.

Further, the gate dielectric layer 3002 and the gate conductor layer 5001 are further partially disposed on the first dielectric layer 4001.

Further, the gate conductor layer 5001 is exposed at a portion outside the groove space, and is exposed at another portion outside the groove space.

According to embodiments of the present disclosure, the vertical MOSFET device further includes: a second dielectric layer 4002 disposed on upper surfaces of the gate dielectric layer 3002 and the gate conductor layer 5001, wherein the second dielectric layer 4002 has a same material as the first dielectric layer 4001.

According to embodiments of the present disclosure, the spacing layer 3001 is aligned with a lateral outer edge of the first source/drain layer 1003 and a lateral outer edge of the second source/drain layer 1007.

According to embodiments of the present disclosure, the vertical MOSFET device further includes: metal contact portions respectively embedded in the first source/drain layer 1003, the gate conductor layer 5001 and the second source/drain layer 1007.

It should be noted that embodiments of the apparatus portion is similar to embodiments of the method portion, and the achieved technical effects are also similar, and for specific details, please refer to embodiments of the method portion, which is not repeated herein.

Based on a same inventive concept, embodiments of the present disclosure further provide a method of manufacturing a vertical MOSFET device, including following steps.

In Step S1, a first source/drain layer 1003, a channel layer 200 and a second source/drain layer 1007 are sequentially formed on a substrate in a vertical direction, wherein an active region includes the first source/drain layer 1003, the channel layer 200 and the second source/drain layer 1007, and an outer periphery of the channel layer 200 has a recess portion with respect to an outer periphery of the first source/drain layer 1003 and an outer periphery of the second source/drain layer 1007.

In Step S2, a dummy structure layer 1009 is covered on an outer surface of the active region; the dummy structure layer 1009 is selectively etched, so that an upper surface of the first source/drain layer 1003 and a lower surface of the second source/drain layer 1007 respectively retain a second portion dummy structure layer 10092, wherein the second portion dummy structure layer 10092 sandwiches the channel layer 200 from opposite sides of the channel layer 200.

In Step S3, a dummy gate structure layer 2001 is grown in a groove space formed by an inner wall of the second portion dummy structure layer 10092 and the outer periphery of the channel layer 200, and the second portion dummy structure layer 10092 is replaced with a spacing layer 3001.

In Step S4, a first dielectric layer 4001 is formed on the first source/drain layer 1003, the dummy gate structure layer 2001 is removed, and a gate dielectric layer 3002 and a gate conductor layer 5001 are formed on the groove space and the first dielectric layer 4001.

In Step S5, the gate conductor layer 5001 is selectively etched, and metal contact portions are formed on the first source/drain layer 1003, the gate conductor layer 5001 and the second source/drain layer 1007, respectively.

Since a function of the dummy structure layer 1009 is to fill and occupy a certain space in the recess portion of the channel layer 200 and facilitate subsequent replacement with the spacing layer 3001, the dummy structure layer 1009 may also be referred to as "a position retaining layer", or "a sacrificial layer".

FIG. 1 to FIG. 12 schematically show flowcharts of different stages of a method of manufacturing a storage device according to embodiments of the present disclosure. FIG. 1 schematically shows a cross-sectional view of a stack disposed on a substrate.

As shown in FIG. 1, a substrate 1001 is provided. The substrate 1001 may be in various forms, including but not limited to a bulk semiconductor material substrate such as a bulk Si substrate, a semiconductor-on-insulator (SOI) substrate, a compound semiconductor substrate such as a SiGe substrate, and the like. In the following descriptions, for ease of description, the bulk Si substrate is illustrated by way of example. Here, a silicon wafer is provided as the substrate 1001.

In the substrate 1001, a well region may be formed. If a p-type device is to be formed, the well region may be an n-type well; and if an n-type device is to be formed, the well region may be a p-type well. Generally, in a DRAM, the storage unit is based on the n-type device. Therefore, for example, the p-type well may be formed by injecting a p-type dopant such as boron (B) into the substrate 1001 and then performing a thermal annealing. For example, a doping concentration of boron (B) may be about 1E19 to $1E21/cm^{-3}$.

Hereinafter, a formation of the n-type device is illustrated by way of example. It is clear to those skilled in the art that the following description is also applicable to the p-type device by, for example, appropriately adjusting a doped conductive type.

On the substrate 1001, a first source/drain layer 1003, a channel defining layer 1005, and a second source/drain layer 1007 may be formed, for example, by an epitaxial growth. The first source/drain layer 1003 may be used to define a position of a lower source/drain portion, and may have a thickness of, for example, about 10 nm to 100 nm. The channel defining layer 1005 may be used to define a position of the channel, and may have a thickness of, for example, about 10 nm to 100 nm. The second source/drain layer 1005 may be used to define a position of an upper source/drain portion, and may have a thickness of, for example, about 10 nm to 100 nm.

Adjacent layers in the first source/drain layer 1003, the channel defining layer 1005, and the second source/drain layer 1007 may have an etching selectivity relative to each other. For example, the first source/drain layer 1003 may include Si, the channel defining layer 1005 may include SiGe (a composition of Ge may be, for example, about 10% to 40%), and the second source/drain layer 1007 may include Si.

The first source/drain layer 1003 and the second source/drain layer 1007 may adopt a low-temperature epitaxial process, and a growth temperature should be less than 900° C. to avoid impurity diffusion. In other embodiments, other doping methods may also be used, such as implantation or gas phase diffusion technology. The first source/drain layer 1003 and the second source/drain layer 1007 may be doped in situ while being grown, so as to (at least partially) define a doping characteristic of a source/drain portion.

It should also be noted that FIG. 1 schematically shows lateral directions x, y and a vertical direction z. The x, y directions may be parallel to a top surface of the substrate 1001 and may intersect each other, e.g., perpendicular. The z direction may be substantially perpendicular to the top surface of the substrate 1001.

The substrate is a (110) crystal plane, and the channel layer is a (001) crystal plane.

Figure 2:
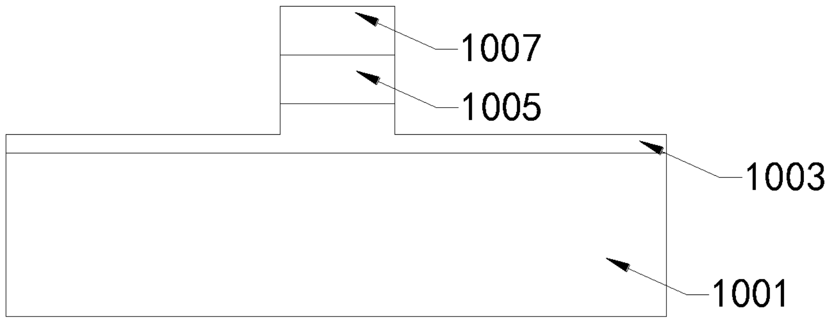

FIG. 2 schematically shows a cross-sectional view of etching a first source/drain layer on a stack.

As shown in FIG. 2, a photoresist (not shown in FIG. 2) is formed on a stack of the first source/drain layer 1003, the channel defining layer 1005 and the second source/drain layer 1007, and the photoresist is patterned to a desired shape by photolithography (exposure and development). The second source/drain layer 1007, the channel defining layer 1005 and the first source/drain layer 1003 may be selectively etched sequentially by, for example, Reactive Ion Etching (RIE) by using the patterned photoresist as a mask. The etching proceeds to a middle portion of the first source/drain layer 1003, but does not proceed to a bottom surface of the first source/drain layer 1003. Thus, upper portions of the etched second source/drain layer 1007, the channel defining layer 1005 and the first source/drain layer 1003 are formed into a columnar shape. RIE may be performed in a direction approximately perpendicular to a surface of the substrate 1001, so that the columnar shape is also approximately perpendicular to the surface of the substrate 1001. After that, the photoresist may be removed.

The active region of the vertical MOSFET device is thereby defined, and the active region includes an upper portion of the etched first source/drain layer 1003, the channel defining layer 1005, and the second source/drain layer 1007. At this point, a spacer is formed on outer peripheries of two opposite sides of the channel defining layer 1005 in the x direction, and the spacer is the x direction crystal plane.

Figure 3:
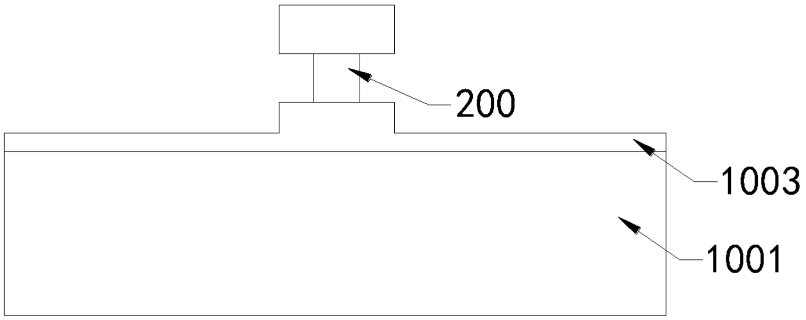

FIG. 3 schematically shows a cross-sectional view of forming a channel layer by a selective etching.

As shown in FIG. 3, the channel defining layer 1005 is selectively etched so that an outer periphery of the channel defining layer 1005 is recessed with respect to outer peripheries of the first source/drain layer 1003 and the second source/drain layer 1007, and a channel layer 200 is formed.

Specifically, the present disclosure may perform etching along the outer periphery of the channel defining layer 1005 toward the middle, and retain the channel defining layer 1005 in the middle portion, thereby forming an approximately cylindrical channel layer 200. The recess portion formed in this way may be self-aligned to the channel layer 200.

In order to better control an etching depth, the selective etching may use wet etching or atomic layer etching (ALE). Thus, in this embodiment, the channel layer 200 having the recess portion may be formed on the substrate 1001.

Figure 4:
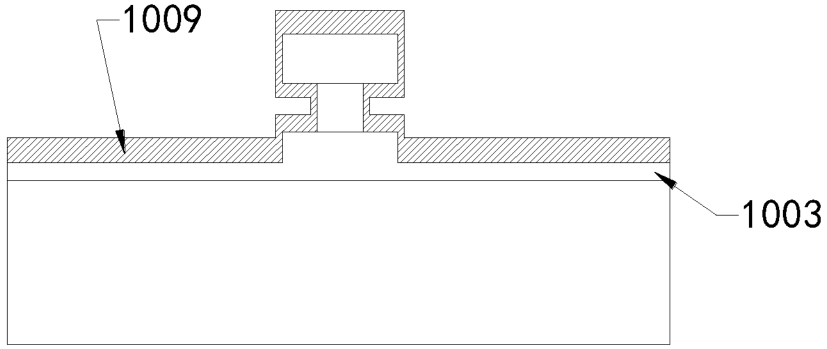

FIG. 4 schematically shows a cross-sectional view of covering a dummy structure layer on an outer surface of an active region.

As shown in FIG. 4, a dummy structure layer 1009 is epitaxially grown on surfaces of the second source/drain layer 1007, the channel layer 200 and the first source/drain layer 1003. A material of the dummy structure layer 1009 may be SiGe, and a composition of Ge is about 20% to 70%. Thus, the composition of Ge in the dummy structure layer 1009 is higher than that in the channel layer 200.

Thus, the dummy structure layer 1009 covers outer surfaces of the second source/drain layer 1007, the channel layer 200 and the first source/drain layer 1003. It should be noted that since an epitaxial growth rate in the y direction is higher than that in the x direction, during an epitaxial growth process, the dummy structure layer 1009 in the x direction in FIG. 4 is thicker than the dummy structure layer 1009 in the y direction. Therefore, the dummy structure layer 1009 is formed by using a characteristic that growth rates on different crystal planes are different.

Figure 5:
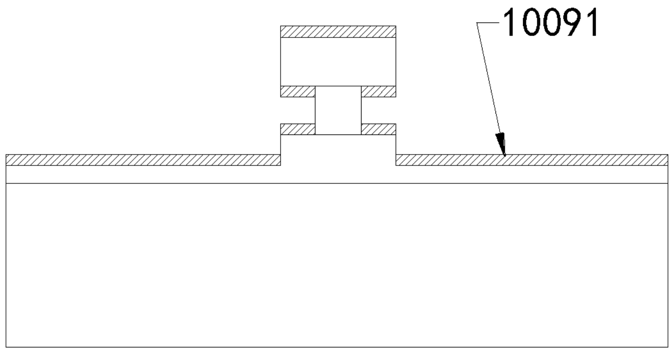

FIG. 5 schematically shows a cross-sectional view of a primary selective etching of the dummy structure layer.

As shown in FIG. 5, the dummy structure layer 1009 is partially etched by using Atomic Layer Etching (ALE) method, and the first portion dummy structure layer 10091 in the y direction is retained. The atomic layer etching may be performed by selecting a material having etching selectivity with the SiGe material of the channel layer 200.

Specifically, the partial etching may include: dummy structure layers located on opposite sides of surfaces of the second source/drain layer 1007, the channel layer 200 and the first source/drain layer 1003 in the x direction are etched away in the x direction, and the first portion dummy structure layer 10091 in the y direction is retained.

After atomic layer etching and controlling an etching depth, the first portion dummy structure layer 10091 may retain an approximately same thickness, but the approximately same thickness is smaller than a thickness of the dummy structure layer 1009 epitaxially grown in the y direction in FIG. 4.

Figure 6:
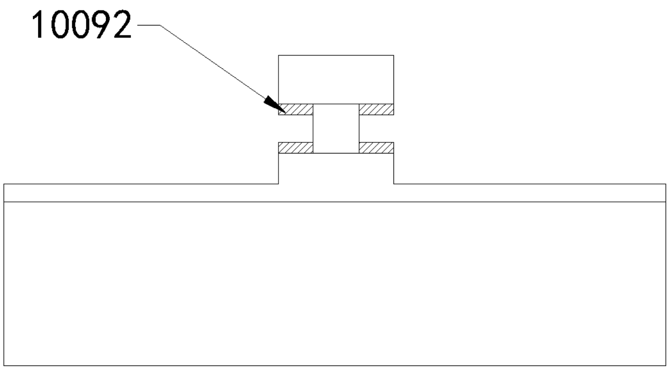

FIG. 6 schematically shows a cross-sectional view of a further selective etching of the dummy structure layer.

As shown in FIG. 6, the first portion dummy structure layer 10091 is partially etched by using the reactive ion etching method, and the second portion dummy structure layer 10092 in the recess portion of the channel layer 200 is retained.

Specifically, the second portion dummy structure layer 10092 is located on the upper surface of the first source/drain layer 1003 and the lower surface of the second source/drain layer 1007, respectively, and horizontally sandwiches the channel layer 200 from opposite sides of the channel layer 200. The second portion dummy structure layer 10092 is not retained at a middle position of the channel layer 200.

Figure 7:
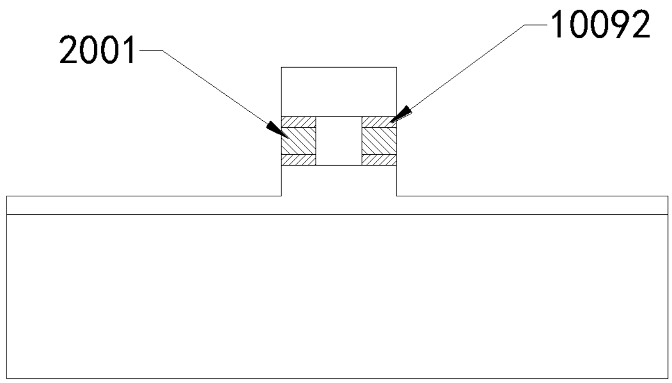

FIG. 7 schematically shows a cross-sectional view of growing a dummy gate structure layer in a groove space.

As shown in FIG. 7, the dummy gate structure layer 2001 is deposited and grown in the groove space formed by the inner wall of the second portion dummy structure layer 10092 and the outer periphery of the channel layer 200. A material of the dummy gate structure layer 2001 may be SiC.

In order to control a deposition growth size, redundant dummy gate structure layer 2001 located at an edge of the second portion dummy structure layer 10092 needs to be etched away by the reactive ion etching to form the dummy gate structure layer 2001 which is aligned with outer edges of the second source/drain layer 1007 and the first source/drain layer 1003. Thus, the dummy gate structure layer 2001 is filled, so as to fill the groove space where the channel layer 200 is located.

Figure 8:
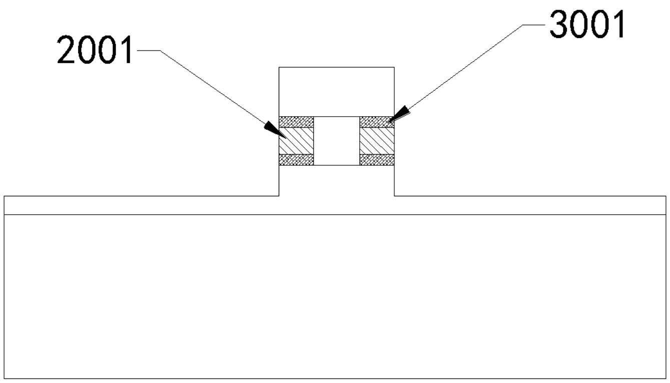

FIG. 8 schematically shows a cross-sectional view of a spacing layer after replacement.

As shown in FIG. 8, the second portion dummy structure layer 10092 is selectively etched away, and a spacing layer 3001 is deposited and grown on a corresponding position of the second portion dummy structure layer 10092. Thus, the second portion dummy structure layer 10092 is replaced with the spacing layer 3001. Specifically, the spacing layer 3001 includes an upper spacing layer and a lower spacing layer, wherein the upper spacing layer is formed on the lower surface of the second source/drain layer 1007 exposed by the recess of the channel layer 200, and the lower spacing layer is formed on the upper surface of the first source/drain layer 1003 exposed by the recess of the channel layer 200, and the upper spacing layer and the lower spacing layer are both in contact with the side surface of the channel layer 200 and are not in communication with each other.

The spacing layer 3001 may be made of a dielectric material with a low dielectric constant or a SiN material. The deposition growth method may adopt atomic layer deposition or chemical vapor deposition.

It should be noted that, in order to control the deposition growth size, redundant spacer layer 3001 located at an outer edge of a corresponding position of the second portion dummy structure layer 10092 needs to be etched away by the reactive ion etching, so as to form the spacing layer 3001 which is aligned with the lateral outer edges of the second source/drain layer 1007 and the first source/drain layer 1003.

Figure 9:
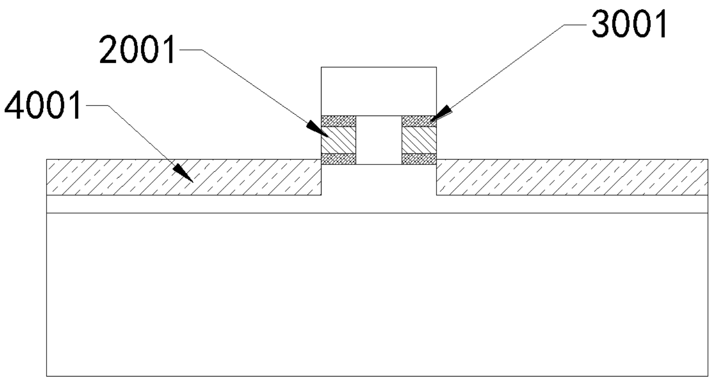

FIG. 9 schematically shows a cross-sectional view of forming a first dielectric layer.

As shown in FIG. 9, a first dielectric layer 4001 is deposited and grown on the first source/drain layer 1003, and then the first dielectric layer 4001 is etched back to a preset height. Before the etching back, Chemical Mechanical Polishing (CMP) may be performed on a surface of the deposited and grown first dielectric layer 4001.

A material of the first dielectric layer 4001 may be silicon oxide. The preset height of the first dielectric layer 4001 is higher than a bottom surface of the channel layer 200 and lower than a top surface of the lower spacing layer immediately adjacent the bottom surface of the channel layer 200.

Thus, a height setting of the first dielectric layer 4001 facilitates forming a self-aligned gate structure between the first source/drain layer 1003 and the second source/drain layer 1007 after removing the dummy gate structure layer 2001.

In embodiments of the present disclosure, the term "self-aligned" does not necessarily mean perfect alignment. "Self-aligned" refers to that relative positions between structures are substantially unaffected by process fluctuations, especially lithography fluctuations. Such self-aligned structures are detectable. For example, there may be a plurality of such devices in an integrated circuit (IC), and if the devices are of a self-aligned structure, a positional relationship of a low-k dielectric layer and the spacer in each device with respect to an end portion of the channel region may remain substantially unchanged, and if the devices are not a self-aligned structure, this relative positional relationship may present process fluctuations between devices.

Figure 10:
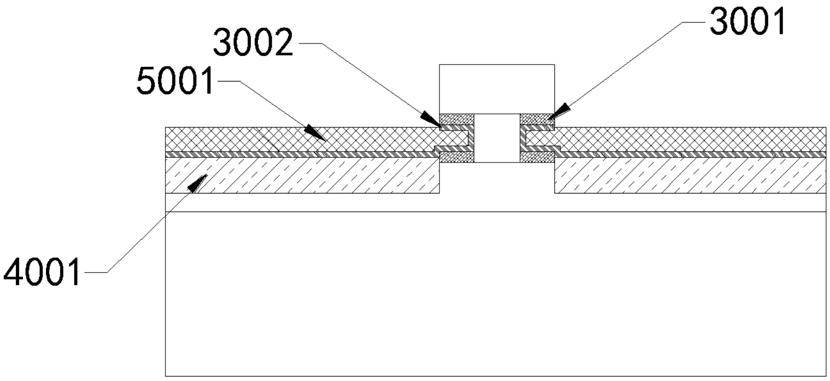

FIG. 10 schematically shows a cross-sectional view of forming a gate dielectric layer and a gate conductor layer.

As shown in FIG. 10, the dummy gate structure layer 2001 is removed, the gate dielectric layer 3002 is deposited on the groove space and the upper surface of the first dielectric layer 4001, and the gate conductor layer 5001 is deposited on the surface of the gate dielectric layer 3002.

The gate dielectric layer 3002 may be made of a dielectric material having a high dielectric constant, such as $HfO_2$, with a thickness of about 1 nm to 5 nm. The gate conductor layer 5001 may be deposited and formed on the surface of the gate dielectric layer 3002 in a substantially conformal manner so as to extend along the surface of the gate dielectric layer 3002. In addition, before depositing the gate dielectric layer 3002, an interface layer such as silicon oxide material (not shown in FIG. 10) with a thickness of about 0.3 nm to 1.5 nm may also be formed.

The gate conductor layer 5001 may include a work function adjusting metal and a gate conductive metal. The work function adjusting metal may include, for example, a TiN material with a thickness of, for example, about 1 nm to 10 nm. The gate conductive metal may include, for example, a W material with a thickness of about 100 nm to 800 nm.

Thus, the gate conductor layer 5001 may fill a space between active regions of each device. The gate stack formed in this way (including the gate dielectric layer 3002 and the gate conductor layer 5001) may be embedded between the first source/drain layer 1003 and the second source/drain layer 1007, and the gate stack is formed at least on the lateral outer periphery of the channel layer 200 and embedded in the groove space between the upper spacing layer and the lower spacing layer. In order to control the etching depth, it is necessary to etch back the formed gate stack finally.

Figure 11A:
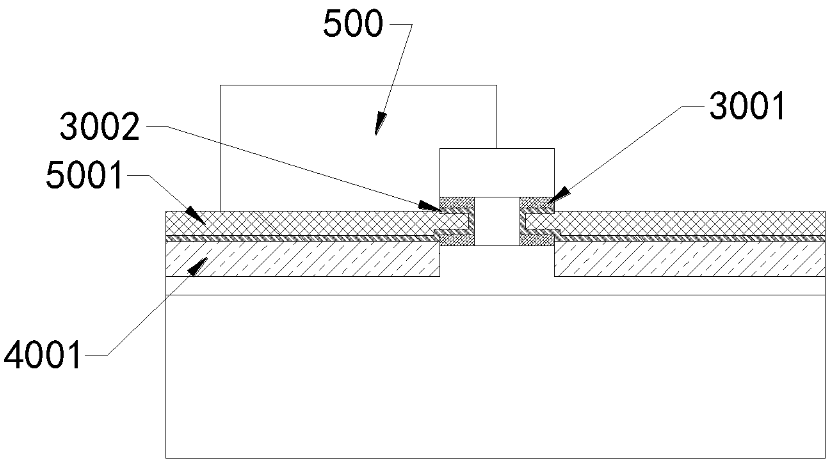
Figure 11B:
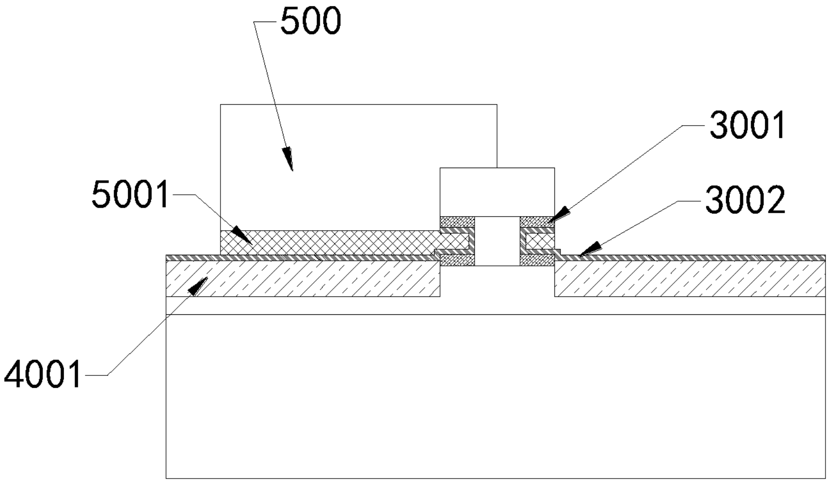

FIG. 11(*a*) schematically shows a cross-sectional view of spin-coating a photoresist on the gate conductor layer. FIG. 11(*b*) schematically shows a cross-sectional view of etching the gate conductor layer.

As shown in FIG. 11(*a*), a photoresist 500 is spin-coated on the gate conductor layer 5001 to form a gate pattern.

The photoresist 500 is patterned, for example, by photolithography to cover a portion of the gate conductor layer 5001 exposed outside the groove space of the channel layer 200 (in this example, a left half of FIG. 11(*a*)), and to expose another portion of the gate conductor layer 5001 exposed outside the groove space of the channel layer 200 (in this example, a right half of FIG. 11(*a*)).

Then, as shown in FIG. 11(*b*), by using the patterned photoresist 500 as a mask, the gate conductor layer 5001 is etched by, for example, RIE, which may be performed in a vertical direction, and then the photoresist 500 is removed.

Therefore, in addition to a portion of the gate conductor layer 5001 retained in the groove space, a portion shielded by the photoresist 500 is also retained.

Figure 12:
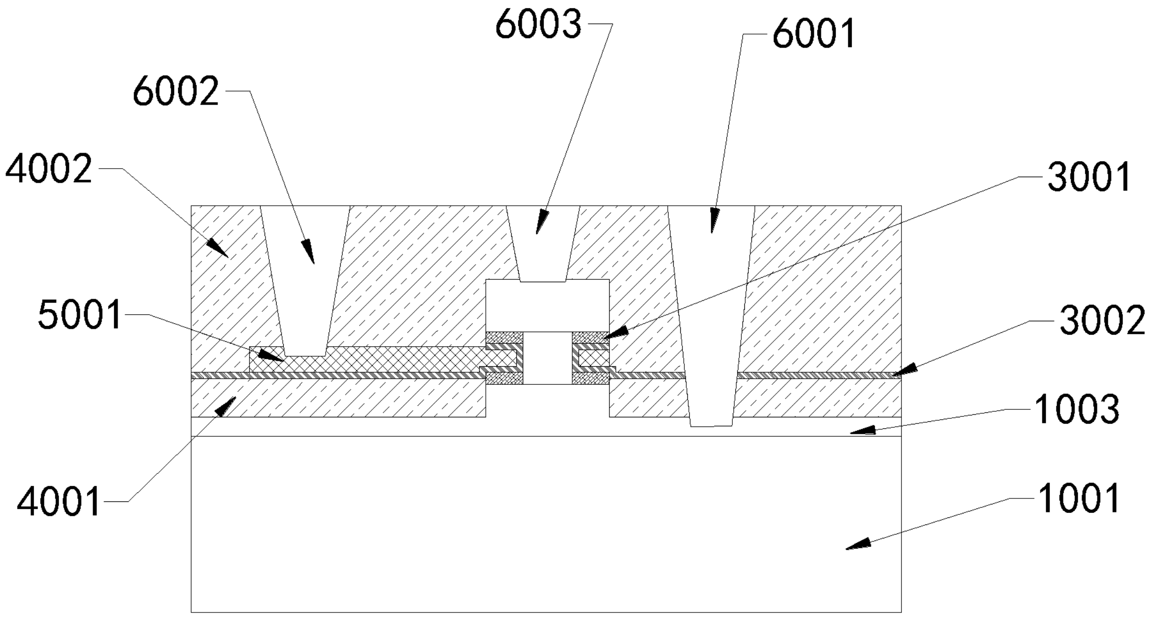

FIG. 12 schematically shows a cross-sectional view of forming a metal contact portion.

As shown in FIG. 12, the second dielectric layer 4002 is deposited on exposed upper surfaces of the gate dielectric layer 3002 and the gate conductor layer 5001, and chemical mechanical polishing is performed. Metal contact portions are formed on the first source/drain layer 1003, the gate conductor layer 5001, and the second source/drain layer 1007, respectively. These metal contact portions may be formed by etching holes in the second dielectric layer 4002 and the first dielectric layer 4001 and filling them with a conductive material such as a metal.

Specifically, the second dielectric layer 4002 may be the same as the first dielectric layer 4001, that is, a material of the second dielectric layer 4002 may also be silicon oxide. The metal contact portions include: a first source/drain contact portion 6001 formed on the first source/drain layer 1003, a gate contact portion 6002 formed on the gate conductor layer 5001, and a second source/drain contact portion 6003 formed on the second source/drain layer 1007. The first source/drain contact portion 6001, the gate contact portion 6002, and the second source/drain contact portion 6003 may be formed using a conventional process.

In addition, since the gate conductor layer 5001 extends beyond the outer periphery of the active region, the gate contact portion 6002 may be easily formed. Meanwhile, since the gate conductor layer 5001 does not exist over at least a portion of the first source/drain layer 1003, the first source/drain contact portion 6001 may be easily formed.

Thus, the vertical MOSFET device of embodiments of the present disclosure is manufactured. The vertical MOSFET device of embodiments has the function of self-aligned spacer, and a dummy spacer structure is formed by using the characteristic that epitaxial growth rates on different crystal planes are different, and the epitaxial growth rate in the channel direction is relatively high.

Compared with the related art, the vertical MOSFET device and the method of manufacturing a vertical MOSFET device provided by the present disclosure have at least following beneficial effects: the vertical MOSFET device has a function of self-aligned spacer, and uses a characteristic that epitaxial growth rates on different crystal planes are different to form a dummy spacer structure, and an epitaxial growth rate in a channel direction is relatively high.

The vertical MOSFET device according to embodiments of the present disclosure may be applied to various electronic devices. For example, the electronic device may include the vertical MOSFET device and a processor. The vertical MOSFET device may store data required for an operation of the electronic device or data obtained during an operation. The processor may operate based on data and/or applications stored in the vertical MOSFET device. The electronic device may include, for example, a smart phone, a personal computer (PC), a tablet computer, a wearable device, an artificial intelligence device, a portable power source, and so on.

In the above description, the technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A vertical MOSFET device, comprising:

a substrate;

an active region comprising a first source/drain layer, a channel layer and a second source/drain layer vertically stacked on the substrate in sequence, wherein an outer periphery of the channel layer is recessed with respect to an outer periphery of the first source/drain layer and an outer periphery the second source/drain layer;

a spacing layer comprising an upper spacing layer and a lower spacing layer, wherein the upper spacing layer is formed on a lower surface of the second source/drain layer exposed by a recess of the channel layer, the lower spacing layer is formed on an upper surface of the first source/drain layer exposed by the recess of the channel layer, and the upper spacing layer and the lower spacing layer are both in contact with a side surface of the channel layer and are not in communication with each other; and a gate stack formed at least on a lateral outer periphery of the channel layer and embedded in a groove space between the upper spacing layer and the lower spacing layer, wherein an outer sidewall of the upper spacing layer, an outer sidewall of the lower spacing layer, an outer sidewall of the first source/drain layer, and an outer sidewall of the second source/drain layer are aligned.

2. The vertical MOSFET device according to claim 1, wherein each of the first source/drain layer, the channel layer and the second source/drain layer has a thickness of 10 nm to 100 nm.

3. The vertical MOSFET device according to claim 1, wherein the gate stack comprises a gate dielectric layer and a gate conductor layer, and the gate conductor layer comprises a work function adjusting metal and a gate conductive metal disposed on the work function adjusting metal.

4. The vertical MOSFET device according to claim 1, further comprising a first dielectric layer disposed on the first source/drain layer.

5. The vertical MOSFET device according to claim 4, wherein a height of the first dielectric layer is higher than a bottom surface of the channel layer and lower than a top surface of the lower spacing layer immediately adjacent the bottom surface of the channel layer.

6. The vertical MOSFET device according to claim 4, wherein the gate dielectric layer and the gate conductor layer are further partially disposed on the first dielectric layer.

7. The vertical MOSFET device according to claim 6, wherein the gate conductor layer is exposed at a portion outside the groove space, and is exposed at another portion outside the groove space.

8. The vertical MOSFET device according to claim 4, further comprising:

a second dielectric layer disposed on an upper surface of the gate dielectric layer and an upper surface of the gate conductor layer, wherein the second dielectric layer has a same material as the first dielectric layer.

9. The vertical MOSFET device according to claim 1, wherein the spacing layer is aligned with a lateral outer edge of the first source/drain layer and a lateral outer edge of the second source/drain layer.

10. The vertical MOSFET device of according to claim 1, further comprising:

metal contact portions respectively embedded in the first source/drain layer, the gate conductor layer, and the second source/drain layer.

11. The vertical MOSFET device according to claim 1, wherein the substrate is a crystal plane, and the channel layer is a crystal plane.

12. An electronic device, comprising the vertical MOSFET device according to claim 1.

13. The electronic device according to claim 12, wherein the electronic device comprises a smart phone, a computer, a tablet computer, a wearable smart device, an artificial intelligence device, and a portable power source.

* * * * *